(12) United States Patent
Inagaki et al.

(10) Patent No.: US 8,123,387 B2
(45) Date of Patent: Feb. 28, 2012

(54) LED LAMP DEVICE

(75) Inventors: Satoshi Inagaki, Aichi-ken (JP); Hiroshi Ito, Aichi-ken (JP); Akihiro Misawa, Aichi-ken (JP); Yukiko Marui, Aichi-ken (JP)

(73) Assignee: Toyoda Gosei Co., Ltd., Aichi-ken (JP)

( * ) Notice: Subject to any disclaimer, the term of this patent is extended or adjusted under 35 U.S.C. 154(b) by 368 days.

(21) Appl. No.: 11/907,114

(22) Filed: Oct. 9, 2007

(65) Prior Publication Data
US 2008/0094848 A1 Apr. 24, 2008

(30) Foreign Application Priority Data
Oct. 11, 2006 (JP) ................ P. 2006-277373

(51) Int. Cl.
*F21S 8/08* (2006.01)
(52) U.S. Cl. ........................ 362/411; 362/800
(58) Field of Classification Search .................. 362/411, 362/800
See application file for complete search history.

(56) References Cited

U.S. PATENT DOCUMENTS
6,888,723 B2 * 5/2005 Kamiya et al. ............ 362/245
2006/0261362 A1 * 11/2006 Noda et al. ................ 257/98

FOREIGN PATENT DOCUMENTS
JP  11-103096  4/1999
JP  2000-216442  8/2000
JP  2003-258314  9/2003

* cited by examiner

*Primary Examiner* — William Carter
(74) *Attorney, Agent, or Firm* — McGinn IP Law Group, PLLC (57) ABSTRACT

In an LED lamp device including a surface mount device type of LED lamp, an LED lighting circuit protecting part, a resistive element, a circuit part, and a case part, the circuit part has a metal plate which is embedded in the case part in a state where the metal plate is partially exposed, the LED lamp is mounted on the exposed portion on a front side of the metal plate, and the resistive element is mounted on the exposed portion on a rear side of the metal plate.

20 Claims, 6 Drawing Sheets

LED LAMP DEVICE

BACKGROUND OF THE INVENTION

1. Field of the Invention

The present invention relates to an LED (light emitting diode) lamp device.

2. Description of the Related Art

Heretofore, as LED lamps, a round type and a surface mount device (SMD) type have been known. When these LED lamps are used as, for example, a vehicle lamp, a print board to which a lead of the LED lamp has been soldered is fitted into a case part to constitute an LED lamp device, and this LED lamp device is attached in a predetermined position of the vehicle. The print board is wired to an illumination control device of the vehicle, whereby ON/OFF of the LED and brightness at the LED lighting-up time are controlled by a switch or a control circuit of the vehicle.

In the above-described conventional LED lamp devices, since the print board to which the LED lamp is attached is made of resin, heat-radiating property for heat from the LED lamp or for heat at the mounting time can become insufficient. In order to solve such the problem, the present applicant has proposed, in the prior patent application (Patent Document 1), constitution in which the circuit part is formed of a metal plate thereby to achieve efficient heat-radiation and heighten reliability, and in which there is little influence of heat at the mounting time of the LED lamp thereby to obtain a good manufacturing yield.

Patent Document 1: JP-A-2003-258314
Patent Document 2: JP-A-11-103096
Patent Document 3: JP-A-2000-216442

In the LED lamp device disclosed in the Patent Document 1, an LED lamp, a resistive element, a diode, and the like are coupled on the same side of a metal plate constituting a circuit part. Under this constitution, space for each part and a coupling area of each part onto the metal plate must be secured on the same side, so that miniaturization of the device is difficult. Therefore, the invention has mainly object to provide, in an LED lamp device having a circuit part formed of a metal plate, constitution which enables further miniaturization of the device. Further, the invention has another object to improve heat-radiating property.

SUMMARY OF THE INVENTION

In order to solve the above problems, the first constitution of the invention is as follows:

Namely, an LED lamp device including a surface mount device type of LED lamp, an LED lighting circuit protecting part, a resistive element, a circuit part, and a case part, is characterized in that:

the circuit part has a metal plate which is embedded in the case part in a state where the metal plate is partially exposed;

the LED lamp is mounted on the exposed portion on a front side of the metal plate; and the resistive element is mounted on the exposed portion on a rear side of the metal plate.

Further, the second constitution of the invention is characterized in that the LED lighting circuit protecting part is mounted on the exposed portion on the rear side of the metal plate.

On the other hand, the third constitution of the invention is characterized, in the second constitution, in that the LED lighting circuit protecting part is mounted on the metal plate on the opposite side to the mounting position side of the LED lamp so that the metal plate is sandwiched between the LED lamp and the LED lighting circuit protecting part.

Further, the fourth constitution of the invention is characterized, in any of the first to third constitutions, in that the LED lamp is a surface mount device type of LED lamp that emits light from a mounting surface in the vertical direction.

Further, the fifth constitution of the invention is characterized, in any of the first to fourth constitutions, in that the metal plate includes a first region on which the LED lamp and the LED lighting circuit protecting part are mounted, and a second region which is nearly parallel to the first region and on which the resistive element is mounted.

According to the first constitution of the invention, the resistive element is mounted on the metal plate on the opposite side (rear side) to the side (front side) on which the LED lamp is mounted. Hereby, the distance between the LED lamp and the resistive element can be secured. In result, while suppressing an influence of heat at each mounting time of the LED lamp and the resistive element, these parts can be mounted in small space of the metal plate. Further, since these parts are mounted utilizing the both surfaces of the metal plate, the size of the metal plate can be reduced. Further, since the LED lamp and the resistive element of which both are heat generating parts do not exist on the same side, efficient heat-radiation from these parts is accelerated. The above operational advantage is obtained, with the result that an LED lamp device which is very small in size and good in reliability and manufacturing yield is realized.

According to the second constitution of the invention, similarly to the resistive element, the LED lighting circuit protecting part is also mounted on the metal plate on the opposite side to the side on which the LED lamp is mounted. Hereby, the distance between the LED lamp and the LED lighting circuit protecting part can be readily secured. In result, while suppressing an influence of heat at each mounting time of the LED lamp and the LED lighting circuit protecting part, these parts can be mounted in small space of the metal plate. Hereby, further miniaturization is possible. Further, under this constitution, the protection part is not directly coupled to the leads of the LED lamp unlike the constitutions disclosed in the above Patent Documents 2 and 3. Therefore, at the coupling time of the protection part, the LED lamp never receives a direct influence of heat. Hereby, an LED lamp device which is high in reliability and good in manufacturing yield is realized.

According to the third constitution of the invention, the LED lighting circuit protecting part is mounted so that the metal plate is sandwiched between the LED lamp and the LED lighting circuit protecting part. Hereby, the spaces for the LED lamp and the LED lighting circuit protecting part are reduced, and further miniaturization is achieved.

According to the fourth constitution of the invention, a small-sized and thin-sized LED lamp device which emits vertical light from the metal plate is realized.

According to the fifth constitution of the invention, the metal plate has the second region which is nearly parallel to the first region on which the LED lamp and the LED lighting circuit protecting part are mounted, and the resistive element is mounted on the second region. Hereby, at least a part of the resistive element is accommodated in the space between the first region and the second region. In result, while suppressing increase in occupied space of the metal plate (particularly, space in the thickness direction), the resistive element can be accommodated in the small space, and further miniaturization and thickness-reduction become possible.

BRIEF DESCRIPTION OF THE DRAWINGS

FIG. 1 is a perspective view of an LED lamp device 1 in an embodiment, in which (a) shows a mounting side of an LED lamp 2 and (b) shows a mounting side of a resistor 3.

FIG. 2 is a diagram showing the LED lamp device 1 in the embodiment, in which (a) is a left side view, (b) is a front view, (c) is a right side view, (d) is a back view, (e) is a plan view, (f) is a bottom view, and (g) is a sectional view (taken along a line I-I in (b)).

FIG. 3 is a diagram showing metal plates 11, 12 and 13 constituting a circuit part 10 of the LED lamp device 1, in which (a) is a left side view, (b) is a front view, and (c) is a right side view.

FIG. 6 (a), (b) are diagrams showing examples of the circuit constitution.

DESCRIPTION OF THE PREFERRED EMBODIMENTS

Figure 1:
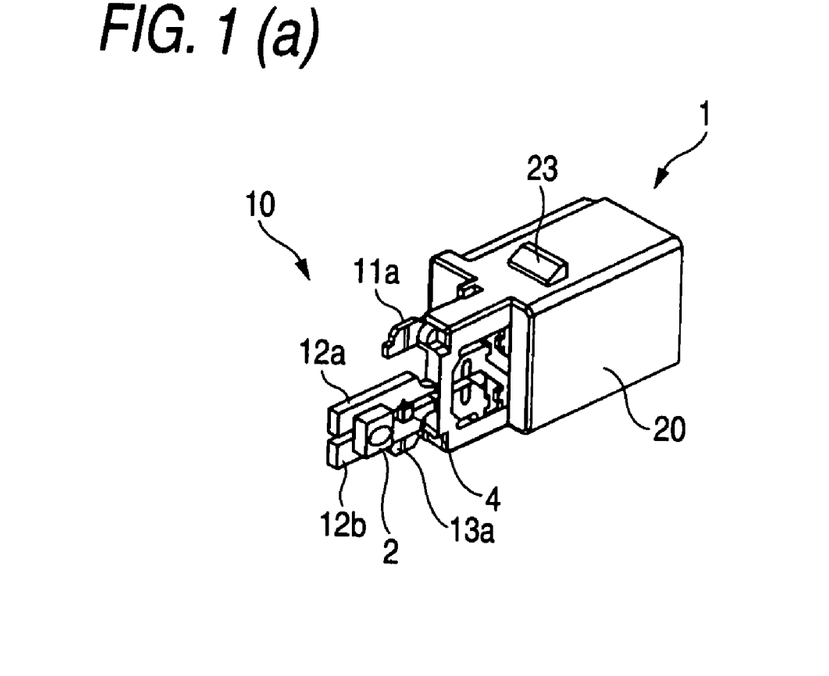
Figure 2:
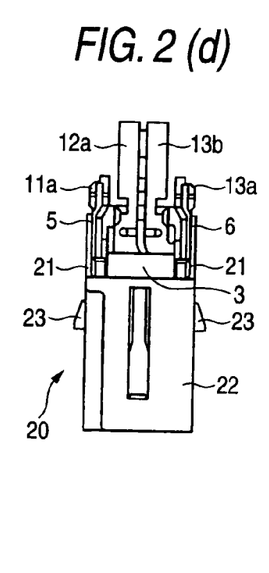

With reference to an embodiment, the invention will be described below in detail. An LED lamp device 1 in the embodiment is shown in FIGS. 1 and 2. FIG. 1 is a perspective view of the LED lamp device 1, in which (a) shows the constitution on the mounting side of an LED lamp 2, and (b) shows the constitution on the opposite side. FIGS. 2(a) to (g) are a left side view of the LED lamp device 1, a front view, a right side view, a back view, a plan view, a bottom view, and a sectional view taken along a line I-I in (b) in this order. The LED lamp device 1 includes the LED lamp 2, a resistor (resistive element) 3, a Zenner diode 4 functioning as an LED lighting circuit protecting part, a circuit part 10, and a case part 20.

Figure 5:
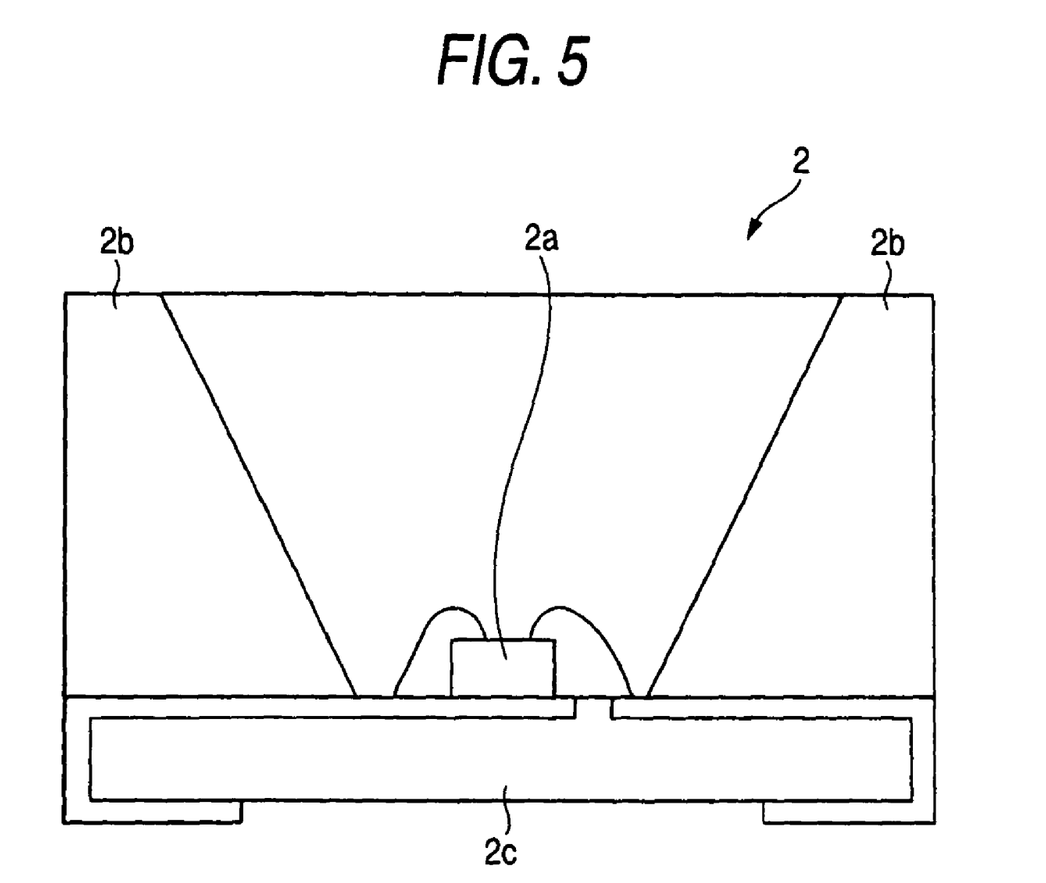
FIG. 5 is a diagram schematically showing the constitution of the LED lamp 2 used in the LED lamp device 1.

As shown schematically in FIG. 5, the LED lamp 2 is an LED lamp of a surface mount device type (SMD type). The LED lamp 2 in this embodiment has therein a blue LED chip 2a composed of an III-group nitride-based compound semiconductor, and includes a reflector 2b around the blue LED chip 2a. The LED lamp 2 emits the light from a substrate 2c in the vertical direction. Since the LED lamp is small in consumption power and heat generation amount, and long in life, it is a light source suited to be lighted continuously for a long time.

The constitution of the used LED lamp and the light emitting color are not particularly limited. Another LED lamp having a light emitting wavelength in a visible area of white, red, orange, green, or the like can be adopted than the blue LED lamp used in the embodiment. Further, an LED lamp can be also used, which converts partially a wavelength of light of an LED chip by a phosphor, and emits light in which the light of the LED chip and fluorescent light are mixed. The phosphor can be, for example, included in sealing resin of the LED lamp. On the surface of the sealing resin, a layer including the phosphor may be provided. Further, an LED lamp in which plural LED chips having the same kind or the different kinds are included can also used.

Figure 3A:
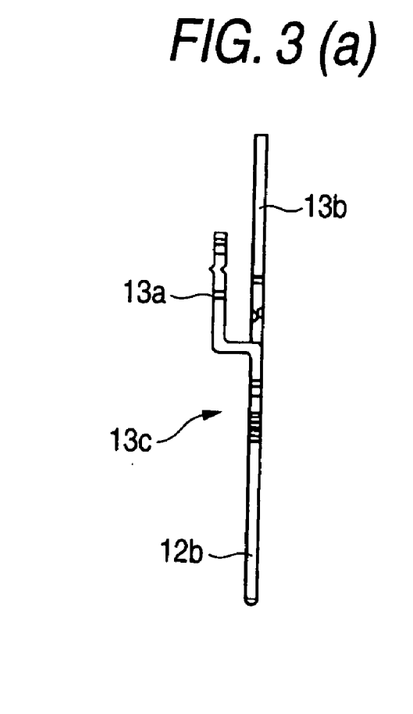
Figure 3B:
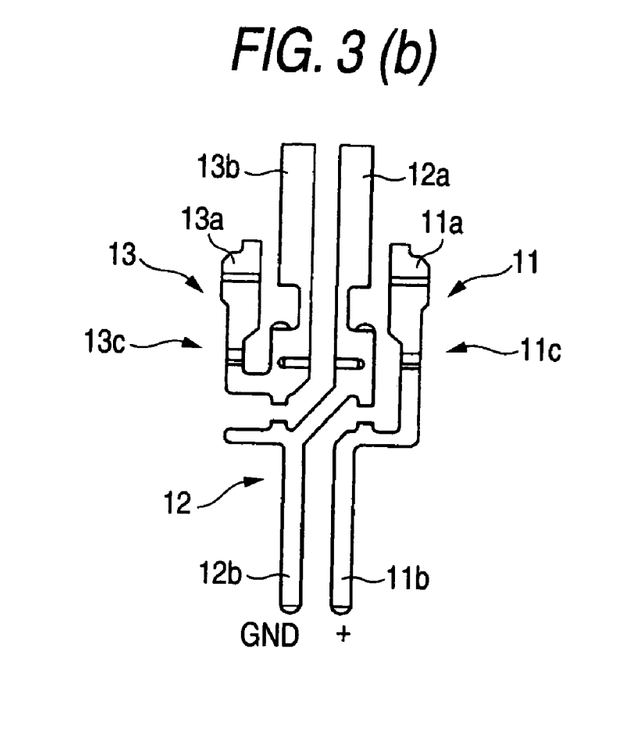
Figure 3C:
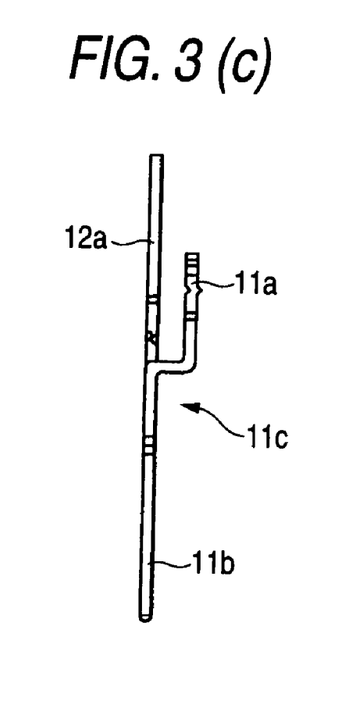

Metal plates 11 to 13 constituting the circuit part 10 of the LED lamp device 1 are shown in FIG. 3. FIGS. 3(a) to (c) are a left side view of the metal plates 11 to 13, a front view, and a right side view in order.

Figure 4:
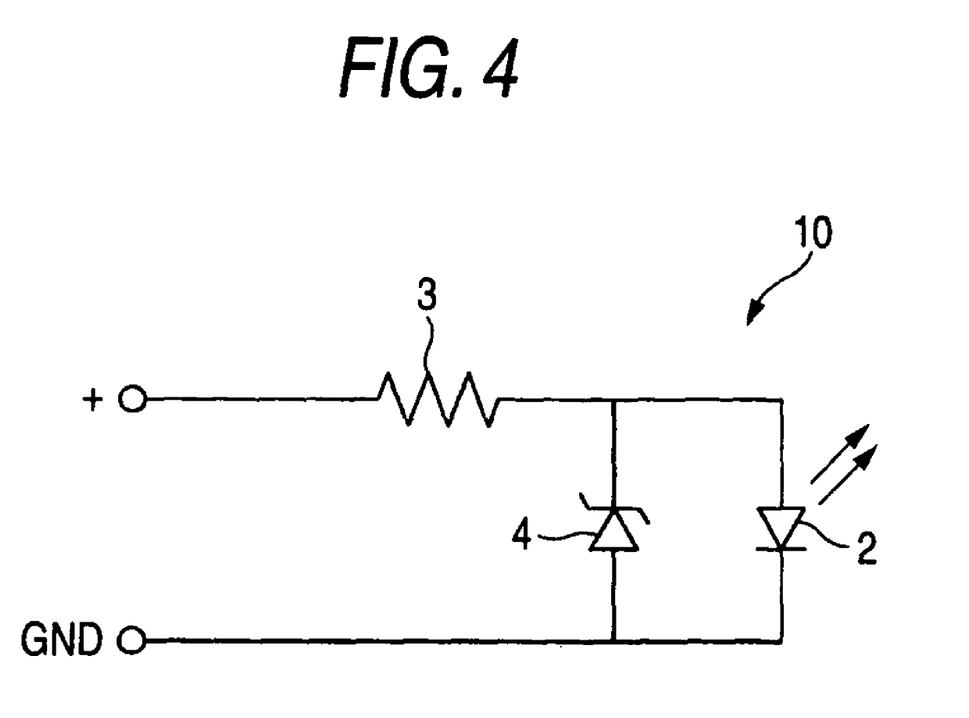
FIG. 4 is a diagram showing the circuit constitution in the LED lamp device 1.

Onto the three metal plates, the LED lamp 2, the resistor 3, and the Zenner diode 4 are mounted (coupled), whereby a circuit shown in FIG. 4 is formed. In the embodiment, an SMD type of Zenner diode 4 is adopted thereby to realize miniaturization of the device. On the other, a lead type of resistor 3 is adopted thereby to realize improvement of reliability.

As shown in FIG. 3, the first metal plate is bent near its center portion 11c, whereby the first metal is divided into two regions which have a parallel relation to each other. Onto the rear side of the region (first region a) located above in the figure, a lead 5 of the resistor 3 is coupled. A leading end portion in the other region becomes a terminal 11b on a plus side.

The second metal plate 12 includes a second region 12a on a front side of which the LED lamp 2 and the Zenner diode 4 are mounted, and a terminal 12b on a ground side.

The third metal plate 13 is bent near its center portion 13c similarly to the first metal plate 11, and includes two regions which are in a parallel relation, that is, a third region 13a and a fourth region 13b. Onto a rear side of the third region 13a, a lead 6 of the resistor 3 is coupled. The other fourth region 13b is located on the same plane as the second metal plate 12, and the LED lamp 2 and the Zenner diode 4 are mounted on the front side of the fourth region 13b. In these metal plates, each mounting portion and each coupling portion are exposed from the case part 20 (refer to FIGS. 1 and 2).

In the LED lamp device 1, the LED lamp 2 and the Zenner diode 4 are mounted on the front side of the metal plate, and the resistor 3 is mounted on the rear side thereof. The LED lamp 2 and the resistor 3 are mounted thus utilizing the both sides of the metal plate, whereby the distance between the LED lamp 2 and the resistor 3 is secured. Hereby, while suppressing an influence of heat on the resistor 3 at the mounting time of the LED lamp 2 (or an influence of heat on the LED lamp 2 at the mounting time of the resistor 3), these parts can be mounted in a saved space. Further, the size of the metal plate can be also reduced. On the other hand, since the LED lamp 2 and the resistor 3 do not exist on the same side, efficient heat-radiation from these parts is accelerated. Since the above operational advantage is obtained, the LED lamp device 1, though it is very small in size, becomes good in reliability and manufacturing yield.

The metal plates 11, 12 and 13 are obtained by blanking and bending electroconductive metal such as copper. As material of the metal plate, a steel plate plated with copper or tin can be also used.

An optical axis of the LED lamp 2 becomes vertical to the metal plate (refer to FIGS. 1 and 2). Hereby, the LED lamp device 1 emits the vertical light in its longitudinal direction.

On the other hand, the coupling parts (first region 11a and third region 13a) to the leads 5 and 6 of the resistor 3, and the mounting parts of the LED lamp 2 and the Zenner diode 4 (second region 12a and fourth region 13b) are constituted so as to have a parallel positional relation (FIG. 3). In result, while suppressing increase in occupied space of the metal plates, the resistor 3 is accommodated between the coupling part and the mounting part, and the compact constitution is realized (refer to FIGS. 2 and 3).

The leads 5 and 6 of the resistor 3 are resistance-welded to the corresponding coupling parts (first region 11a and the third region 13a). When these leads are resistance-welded, heat is applied. However, the metal plate hardly receives the influence of heat, which is different from the conventional example using a print board made of resin. Further, the coupling method between each coupling part and the lead is not limited to resistance-welding, but a method such as soldering or laser welding cab be adopted.

On the other hand, the LED lamp 2 and Zenner diode 4 are soldered to the second region 12a and the fourth region 13b of the metal plates. Further, the mounting method of the LED lamp 2 and Zenner diode 4 is not also limited to soldering.

The metal plates 11, 12, and 13 are inserted into the case part 20, and the case part 20 is injection-molded by means of resin material. Though PBT is molding material of the case part 20 in this embodiment, the molding material is not limited to this material, but general purpose type resin such as PP, PE, ABS or the like, biodegradable resin (bio plastic) such as polylactic acid, ceramics, and the like can be used.

The case part 20 includes a supporting portion 21 for the resistor 3. In this example, the leads 5 and 6 of the resistor 3 are received by the supporting portion 21. One end side of the case part 20 is a connector connecting part 22, which accommodates the terminals 11b and 12b of the metal plates therein. Namely, in the LED lamp device 1, the terminals 11b and 12b of the metal plates are connected to an external connector. Therefore, the shape and the size of the connector connecting part are designed according to those of the external connector. The terminal of the metal plate may be connected to a harness. In this case, the thickness of the case part can be made thinner.

On side walls of the connector connecting part 22, a pair of pawls 23 is formed. The pawls 23 are utilized when a cover described later is attached to the LED lamp device 1, or when the LED lamp device 1 is attached in an installation place.

To the LED lamp device 1, a cover is attached as need. For example, in order to protect a portion on which the part such as the LED lamp 2 is mounted from external shock, the cover is used. Further, the cover can also control distribution of the light from the LED lamp 2, or diffuse or color-convert the light from the LED lamp 2. For example, by using a cover which forms, around a lens part of the LED lamp 2, a tapered surface of which the diameter expands in the tapered shape, the radiation angle of light radiated from the LED lamp 2 can be specified by the tapered surface. When the light from the LED lamp 2 is reflected on the tapered surface, the reflection light and light (non-reflection light) directly radiated from the LED lamp 2 in the direction of its optical axis interfere with each other, so that there is fear that annular interference fringes are produced. Therefore, it is preferable to prevent substantially the light from the LED lamp 2 from being reflected on this tapered surface. As a measure for preventing substantially the light from being reflected, the light directly impinging from the LED lamp 2 on the tapered surface is diffused or absorbed. In order to diffuse the light, it is preferable that the tapered surface is subjected to finely irregular processing such as embossment (for example, 100 percent mat embossed pattern). In order to absorb the light from the LED lamp 2, the tapered surface can be colored in black or the like.

The LED lamp device 1 is used as, for example, a light source of the device illuminating the inside of a vehicle room. In the using time, the terminals 11b and 12b of the LED lamp device 1 are connected to the connector, whereby the LED lamp device 1 is coupled to electric wiring on the vehicle side, and controlled by a vehicle controller. When the LED lamp device 1 is used as, for example, a vehicle room lamp, ON/OFF of the LED lamp 2 and brightness in an ON state are controlled according to opening and closing of a door.

In the LED lamp device 1, the LED lamp 2 and the Zenner diode 4 are mounted on the same surface side (front side) of the metal plates. However, utilizing the both surfaces of the metal plates, these parts may be mounted. According to its constitution, the distance between the LED lamp 2 and the Zenner diode 4 is readily secured. Accordingly, while suppressing an influence of heat at the mounting time of the respective parts, these parts can be mounted in the small space of the metal plates, so that further miniaturization is achieved. Particularly, in case that the LED lamp 2 and the Zenner diode 4 are mounted in such a positional relation that the metal plates are sandwiched between the LED lamp 2 and the Zenner diode 4, the space necessary to mount these parts is reduced, so that an extremely small device is realized.

Though the LED lamp device 1 in the embodiment has only one LED lamp, it may have plural LED lamps. The number of the metal plates constituting the circuit part 10 may be increased, and the plural LED lamps may be controlled independently.

Figure 6:
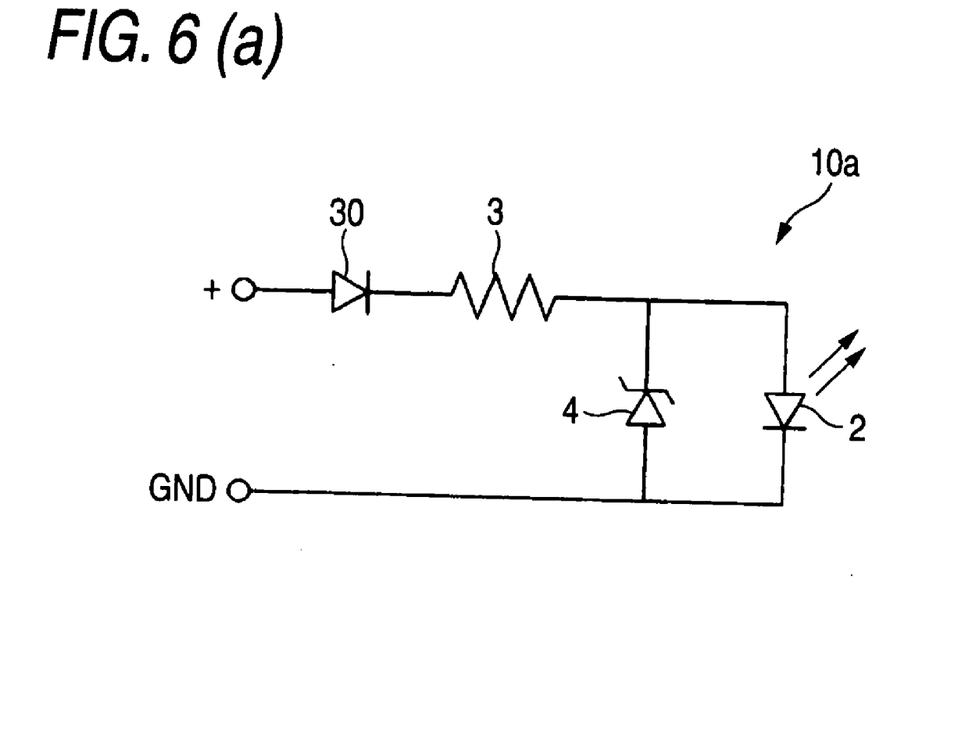

Another example of the circuit constitution is shown in FIG. 6. The same members as those in FIG. 4 are denoted by the same numerals and description of them is omitted. In a circuit part 10a shown in FIG. 6(a), a rectifying diode 30 is provided in series with the LED lamp 2, which protects the LED lamp 2 from high voltage applied in the opposite direction. In a circuit part 10b shown in FIG. 6(b), a rectifying diode 30 is similarly provided, and a Zenner diode 4 is omitted.

The LED lamp device of the invention can be utilized as a light source for various illumination devices and light emitting devices. For example, The LED lamp device of the invention is suitably used as a light source of a vehicle room lamp (map lamp, foot lamp, or the like), an indicator, and the like.

This invention is not limited to the embodiment of the above invention and the description of the embodiment. Without departing from description of the claims, various modifications within a range at which those skilled in the art can readily arrive are also included in this invention.

What is claimed is:

1. An LED lamp device, comprising:
  a surface mount device type of an LED lamp;
  an LED lighting circuit protecting part;
  a resistive element;
  a circuit part; and
  a case part;
  wherein the circuit part has a metal plate which is embedded in the case part such that the metal plate is partially exposed,
  wherein the LED lamp is mounted on an exposed portion on an upper surface of the metal plate,
  wherein the resistive element is mounted on the exposed portion on a lower surface of the metal plate, said lower surface and said upper surface facing opposite directions,
  wherein the metal plate includes a first region on which the LED lamp and the LED lighting circuit protecting part arc mounted, and a second region which is substantially parallel to the first region and on which the resistive element is mounted, and
  wherein the metal plate is bent at a vicinity of a center of the metal plate such that the first region and the second region are separated and substantially parallel to each other in a direction in which the LED emits light.

2. The LED lamp device according to claim 1, wherein the LED lamp comprises a surface mount device type of LED lamp which emits light from a mounting surface in a vertical direction.

3. The LED lamp device according to claim 1, wherein said LED lighting circuit protecting part comprises a diode.

4. The LED lamp device according to claim 1, wherein said LED lighting circuit protecting part is mounted on the upper surface of the metal plate.

5. The LED lamp device according to claim 1, wherein said LED lighting circuit protecting part comprises a rectifying diode connected in series with the LED lamp.

6. The LED lamp device according to claim 1, wherein said metal plate comprises:
   a first plate for connecting to a lead of the resistive element;
   a second plate, placed between the first plate and a third plate, for mounting the LED lamp and the LED lighting circuit protecting part; and
   the third plate for connecting to another lead of the resistive element, and for mounting the LED lamp and the LED lighting circuit protecting part.

7. The LED lamp device according to claim 6, wherein the third plate comprises:
   a first section for coupling to said another lead of the resistive element; and
   a second section, parallel to the first section, which extends up to an end side of the second plate, to connect to the LED lamp and the LED lighting circuit protecting part.

8. The LED lamp device according to claim 6, wherein one side of the second plate extends up to an end side of the first plate, and another side of the second plate extends up to an end side of the third plate.

9. The LED lamp device according to claim 6, wherein an end side of the second plate is co-planar with an end side of the third plate.

10. The LED lamp device according to claim 1, wherein sections of the metal plate that are connected to the LED lamp are confined between sections of the metal plate that are connected to the resistive element.

11. The LED lamp device according to claim 1, wherein said metal plate comprises:
   a first section and a second section, each for connecting to the LED lamp and to the LED lighting circuit protecting part, said second portion being parallel to the first portion; and
   a third section and a fourth section, each for connecting to the resistive element, said third section and said fourth section being placed outside the first portion and the second portion to confine the first portion and the second portion.

12. The LED lamp device according to claim 1, wherein said LED lamp device further comprises a cover formed around a lens part of the LED lamp, said cover having a tapered surface.

13. The LED lamp device according to claim 1, wherein an upper surface of said resistive element and an upper surface of the LED lamp face opposite directions, each of said lower surface of the metal plate and said upper surface of the metal plate comprising a right side and a left side.

14. The LED lamp device according to claim 1, wherein the first region and the second region of the metal plate are bent at the vicinity of the center of the metal plate such that before bent areas of the first region and the second region, sections of the first region and the second region extend substantially parallel to each other, and after the bent areas of the first region and the second region, sections of the first region and the second region extend substantially parallel to each other.

15. An LED lamp device, comprising:
   an LED lamp;
   an LED lighting circuit protecting part;
   a resistive element;
   a case part; and
   a plurality of metal plates embedded in the case part such that the plurality of metal plates comprises an exposed portion,
   wherein the LED lamp is mounted on a section of the exposed portion on an upper surface of a section of the metal plate,
   wherein the resistive element is mounted on another section of the exposed portion on a lower surface of another section of the metal plates, said lower surface and said upper surface facing opposite directions, and
   wherein said another section of the exposed portion is placed outside said section of the exposed portion to confine said section of the exposed portion, and
   wherein at least a part of the metal plate is bent at a vicinity of a center of the metal plate such that the section and said another section are separated and substantially parallel to each other in a direction in which the LED emits light.

16. The LED lamp device according to claim 15, wherein said LED lighting circuit protecting part comprises a diode.

17. The LED lamp device according to claim 16, wherein said plurality of metal plates comprises:
   a first plate for connecting to a lead of the resistive element;
   a second plate, placed between the first plate and a third plate, for mounting the LED lamp and the LED lighting circuit protecting part; and
   the third plate for connecting to another lead of the resistive element, and for mounting the LED lamp and the LED lighting circuit protecting part.

18. The LED lamp device according to claim 17, wherein the third plate comprises:
   a first region for coupling to said another lead of the resistive element; and
   a second region, parallel to the first region, which extends up to an end side of the second plate, to connect to the LED lamp and the LED lighting circuit protecting part.

19. The LED lamp device according to claim 17, wherein one side of the second plate extends up to an end side of the first plate, and another side of the second plate extends up to an end side of the third plate.

20. The LED lamp device according to claim 17, wherein an end side of the second plate is co-planar with an end side of the third plate.

* * * * *